United States Patent
Toyoda et al.

(10) Patent No.: US 8,345,425 B2
(45) Date of Patent: Jan. 1, 2013

(54) COOLING SYSTEM AND ELECTRONIC APPARATUS APPLYING THE SAME THEREIN

(75) Inventors: Hiroyuki Toyoda, Mito (JP); Tadakatsu Nakajima, Kasumigaura (JP); Yoshihiro Kondo, Tsuchiura (JP); Shigeyuki Sasaki, Kasumigaura (JP); Akio Idei, Hadano (JP); Shigemasa Satoh, Hadano (JP)

(73) Assignee: Hitachi, Ltd., Tokyo (JP)

( * ) Notice: Subject to any disclaimer, the term of this patent is extended or adjusted under 35 U.S.C. 154(b) by 58 days.

(21) Appl. No.: 12/852,556

(22) Filed: Aug. 9, 2010

(65) Prior Publication Data

US 2011/0048676 A1 Mar. 3, 2011

(30) Foreign Application Priority Data

Aug. 28, 2009 (JP) ................. 2009-198179

(51) Int. Cl.
*H05K 7/20* (2006.01)
(52) U.S. Cl. ... 361/700; 361/699; 165/80.4; 165/104.26
(58) Field of Classification Search .................. None
See application file for complete search history.

(56) References Cited

U.S. PATENT DOCUMENTS

| | | | |
|---|---|---|---|
| 5,761,037 A * | 6/1998 | Anderson et al. | 361/700 |
| 6,005,772 A * | 12/1999 | Terao et al. | 361/699 |
| 6,119,767 A | 9/2000 | Kadota et al. | |
| 6,527,045 B1 | 3/2003 | Osakabe et al. | |
| 7,093,647 B2 | 8/2006 | Take | |
| 7,096,928 B2 * | 8/2006 | Phillips et al. | 165/104.21 |
| 7,231,961 B2 * | 6/2007 | Alex et al. | 165/80.4 |
| 7,556,086 B2 * | 7/2009 | Joshi et al. | 165/80.3 |
| 7,719,837 B2 * | 5/2010 | Wu et al. | 361/699 |
| 2005/0081534 A1 | 4/2005 | Suzuki et al. | |
| 2009/0084525 A1 | 4/2009 | Satou et al. | |

FOREIGN PATENT DOCUMENTS

| | | |
|---|---|---|
| JP | 50-142168 A | 11/1975 |
| JP | 5-52491 A | 3/1993 |
| JP | 6-4179 A | 1/1994 |
| JP | 7-106478 A | 4/1995 |
| JP | 7-122869 A | 5/1995 |
| JP | 8-78589 A | 3/1996 |
| JP | 9-264677 A | 10/1997 |
| JP | 2002-81875 A | 3/2002 |
| JP | 2002-374086 A | 12/2002 |
| JP | 2003-197839 A | 7/2003 |
| JP | 2003-247791 A | 9/2003 |
| JP | 2005-122503 A | 5/2005 |
| JP | 2007-72635 A | 3/2007 |
| JP | 2007-163076 A | 6/2007 |
| JP | 2008-185283 A | 8/2008 |
| JP | 2009-88127 A | 4/2009 |

* cited by examiner

*Primary Examiner* — Boris Chervinsky
(74) *Attorney, Agent, or Firm* — Mattingly & Malur, PC (57) ABSTRACT

A cooling system for cooling a CPU 200 mounted on a printed circuit board 100 within a housing thereof, has a heat-receiving jacket 310, being thermally connected with a surface of the CPU generating heat therein, and for evaporating liquid refrigerant stored in a pressure-reduced inner space with heat generation thereof. A condenser 320 receives refrigerant vapor from the heat-receiving jacket for condensing the refrigerant vapor into a liquid by transferring the heat into an outside of the apparatus. A thermo siphon is used for circulating the refrigerant due to phase change thereof, and the condenser has fine grooves on an inner wall surface thereof along a direction of flow of the refrigerant, and is also formed flat in a cross-section thereof, for cooling the refrigerant vapor from the heat-receiving jacket on the inner wall surface thereof, efficiently.

14 Claims, 10 Drawing Sheets

CONVENTIONAL

FIG. 11B

PRESENT INVENTION

COOLING SYSTEM AND ELECTRONIC APPARATUS APPLYING THE SAME THEREIN

This application relates to and claims priority from Japanese Patent Application No. 2009-198179 filed on Aug. 28, 2009, the entire disclosure of which is incorporated herein by reference.

BACKGROUND OF THE INVENTION

The present invention relates to a cooling system for electronic apparatuses, such as, a server, mounting plural numbers of CPUs, each being a heat generation source, within an inside of a housing thereof, and it relates to a cooling system for enabling to achieve energy-saving and small-sizing of the cooling system, as well as, achieving a silent system with applying thermo-siphon therein, and further, an electronic apparatus being suitable to mount such the cooling system therein.

In recent years, within an electronic apparatus, such as, the server, etc., representatively, for example, accompanying with an increase of processing speed thereof, plural numbers of so-called semiconductor devices, such as, central processing units (i.e., CPUs) are mounted on a printed circuit board or a mother board, and such circuit board or the mother board is mounted within a box-like rack, together with plural numbers of hard disk apparatuses, at high density.

By the way, with such semiconductor devices mentioned above, such as, the CPUs, etc., it cannot only maintain the performances or capacity thereof, in general, but also it results into being broken down, depending on cases, if temperature thereof exceeds a predetermined value. For this reason, it is necessary to provide a temperature control with using a cooling, etc., and there is strongly demanded a technology for cooling the semiconductor devices, each increasing an amount of heat generation thereof, effectively.

Under such technical background, for a cooling device to cool down the semiconductor device (i.e., the CPU, etc.), increasing the amount of heat generation therefrom, it is required to have a cooling capacity with high performance, thereby enabling to cool down such the semiconductor device, effectively. However, conventionally, in such an electronic apparatus, such as, the server, etc., there is adopted a cooling apparatus of air cooling method, in general; but judging from such circumstances as was mentioned above, the cooling capacity thereof already comes close to a limit thereof, and for that, expectation is made upon cooling systems of new methods, and as a one among those, attention is focused on a cooling system with utilizing, such as, a water or the like, as a coolant or refrigerant therein.

However, as the conventional technologies relating to the present invention, for example, in the following Patent Document is disclosed a technology, for cooling the heats in the semiconductor devices of a CPU blade, being detachably mounted within a rack by means of a heat-receiving jacket, directly, by means of a heat-receiving jacket; in more details, connecting that heat-receiving jacket with a liquid cooling system within a blade server, in a removable manner, through a valve automatically open/close.

Also, in the following Patent Document 2 is also disclosed a technology for dealing with problems, such as, occupation of a space and/or installation of a housing for exclusive use, etc., when mounting the liquid cooling system. Further, in the following Patent Document 3 is also disclosed a semiconductor apparatus, being suitable for an extra large-sized computer and a super computer, i.e., a technology for connecting it with an external cooling system, thermally, by means of a conduit for supplying a cooling water thereon.

Also, as a technology applying a heat pipe therein, within the following Patent Document 4 is disclosed a technology for achieving a thermal connected between the external cooling system and the semiconductor devices on the CPU blade, for the purpose of easiness of removal or displacement of the CPU blade, by means of an expander in the structure of a socket.

In addition thereto, within the following Patent Document 5 is disclosed an apparatus for cooling semiconductors for use in a vehicle with utilizing a heat pipe therein, wherein in more details thereof, an evaporating area or portion for evaporating a refrigerant (e.g., flon: CFCs and HCFCs) filled up inside due to heat generation of the semiconductors, and a vapor condensation area or portion for condensing the coolant vapor filled up inside through heat irradiation into an outside are connected with, through insulator pipes.

Further, within the following Patent Document 6 is disclosed the improved structure for increasing a capacity of heat transfer of the heat pipe, and also within the following Patent Document 7 is disclosed a method for machining a flat heat pipe.

PRIOR ART DOCUMENTS

Patent Documents

[Patent Document 1] Japanese Patent Laying-Open No. 2002-374086 (2005);
[Patent Document 2] Japanese Patent Laying-Open No. 2007-72635 (2007);
[Patent Document 3] Japanese Patent Laying-Open No. Hei 6-4179 (1995);
[Patent Document 4] Japanese Patent Laying-Open No. Hei 7-122869 (1996);
[Patent Document 5] Japanese Patent Laying-Open No. Sho 50-142168 (1975);
[Patent Document 6] Japanese Patent Laying-Open No. 2003-247791 (2003); and
[Patent Document 7] Japanese Patent Laying-Open No. 2002-81875 (2002).

BRIEF SUMMARY OF THE INVENTION

In the conventional technologies mentioned above, in particular, in cooling systems of the water cooling (i.e., the Patent Documents 1 through 3), since the water, i.e., the refrigerant receiving the heat generating in the semiconductor devices, directly, within the heat-receiving jacket, is guided into a water cooling apparatus, passing through a channel pipe provided within a rack, via the automatically open/close valve, then the cooling system as a whole thereof becomes large in the size or scale thereof, and also since the refrigerant mentioned above is circulated within the system, there is necessity of a refrigerant circulating means, such as, a pump or a reservoir tank, etc., for example.

Also, within the conventional technologies mentioned above, even also within that utilizing the heat pipe therein (in the Patent Documents 4 and 5), there is necessity of a means for guiding the refrigerant vapor absorbing heats therein to an outside of the apparatus, including the expander, etc., for example, thereby radiating the heats. For that reason, heat resistance is generated at a connecting portion between the heat pipe and the heat radiating means, and the heat radiating means must be large in the size thereof, for the purpose of increasing the performances or capacity of heat radiation thereof, and therefore, in the similar manner to the cooling system of the water cooling mentioned above, there is a problem the cooling system as a whole comes to be large in the sizes or scales thereof. Further, with other conventional technologies (the Patent Documents 6 and 7), although disclosing the structure for increasing the capacity of heat transfer of the heat pipe and the machining method of the flat heat pipe therein, but it never mentions therein, about detailed configuration to be applied as the cooling system.

Within the cooling system, such as, in the server, etc., the conventional heat pipe is applied for the purpose of increasing fin efficiency by reducing a difference of temperature between a root or base of an air-cooling fin where heating is conducted and a tip thereof where cooling is conducted. For this reason, it is not necessary to transfer all amounts of heats from the heat generation sources, only by the heat pipe, and then there is not brought about such a problem of dry-out, etc. However, as was mentioned previously, with such the method, the system has already being reached to a limit in small-sizing thereof, and a new cooling system is necessary, and for that purposes, it must be a system being able to transfer of all amounts of heat generations of the heat generation sources (for example, about 100 W for a CPU).

For the purpose of transferring an amount of heats being large much more with the heat difference being smaller much more, it is necessary to make thermal resistance of the cooling system small, however in the case of applying a refrigerant of flon group therein, since a transfer rate of evaporating heat is small comparing to that of the water, there is a problem that the thermal resistance comes to be large. However, since the water has a large surface tension comparing to that of the refrigerant of the flon group, it has a drawback that it easily builds up standing or stagnant water within the condensation area or portion, therefore the thermal resistance easily becomes large in the condensation area or portion. Also, from a viewpoint of the ecology, it is request to apply the water, i.e., being a natural refrigerant, rather than the refrigerant of flon group (CFCs and HCFCs).

Then, according to the present invention, being achieved by taking the drawbacks with the conventional technologies mentioned above into the consideration thereof, an object thereof is to provide a cooling system with applying the thermo siphon therein, being superior in the energy saving and/or the ecology, for enabling to cool down the semiconductor devices accompanying heat generations, such as, the CPUs, effectively, with a relatively simple system configuration, within an electronic apparatus comprising a cooling fan in a housing thereof, such as, a server, for example, and further the structure of an electronic apparatus for applying such cooling system therein.

According to the present invention, for accomplishing the object mentioned above, first of all, there is provided a cooling system for cooling a semiconductor device mounted on an electronic printed circuit board, which is stored within a housing of an electronic apparatus, comprising: a heat-receiving jacket, which is attached on said semiconductor device, being thermally connected with a surface thereof, and which vaporizes a liquid refrigerant received within a pressure-reduced inner space thereof, with heat generation from said semiconductor device; a condenser, which stores the refrigerant vapor from said heat-receiving jacket in a pressure-reduced inner space thereof and condenses the refrigerant vapor by transferring heats into an outside of the apparatus; a first conduit, which guides the refrigerant vapor from said heat-receiving jacket into said condenser; and a second conduit, which guides the liquid refrigerant from said condenser into said heat-receiving jacket, and thereby applying a thermo siphon for circulating said refrigerant due to phase changes thereof, wherein said condenser has a cooling tube for cooling down the refrigerant vapor from said heat-receiving jacket on an inner wall surface thereof, and said cooling tube forms fine grooves on the inner wall surface along a direction of flow of the refrigerant, and is formed flat in a cross-section thereof.

Also, according to the present invention, in the cooling system described in the above, preferably, said cooling conduit is disposed into a vertical direction, and further the inner wall surface of said cooling conduit has a flat portion and a curved portion. And, in the cooling system mentioned above, preferably, at an upper and a lower end of said cooling conduit are provided header portions, respectively, and further heat radiating fins are provided on a periphery of said cooling conduit, and said heat radiating fins are offset-fins.

Also, according to the present invention, in the cooling system described in the above, preferably, said heat-receiving jacket is provided with a porous structure surface on the inner wall surface to be in contact with the surface of said semiconductor, and further, said porous structure surface is formed in an about "L"-like shape. And, the cooling system mentioned above, preferably, further comprises a ventilating means, which is configured to supply an air from the outside of the electronic apparatus onto apart of said condenser, and discharges the heats into the outside of the apparatus from said condenser.

In addition thereto, according to the present invention, also for the purpose of accomplishing the object of the present invention mentioned above, there is provided an electronic apparatus, storing an electronic printed circuit board mounting a semiconductor device on a surface thereof within a housing thereof, and having a cooling fan in a part thereof, thereby cooling equipments stored within said housing with supplying an air from an outside thereon, comprising: a cooling system as described in the above, wherein said condenser building up said cooling system is disposed along a path of the air from the outside, which is supplied by said cooling fan.

And, according to the present invention, in the electronic apparatus, as described in the above, preferably, on said electronic printed circuit board are mounted plural numbers of semiconductor devices, and said cooling system for use of said electronic apparatus is provided for each of said semiconductor devices, respectively, and further comprises said cooling fans in plural numbers thereof, wherein a number of said cooling systems is less than a number of said fooling fans.

With the above-mentioned cooling system, applying the thermo siphon therein, according to the present invention, and further, the electronic apparatus mounting such cooling system thereon, it is possible to cool down the heat generation from the heat-generating bodies disposed on the printed circuit board, with a low cost and high efficiency, within a narrow space within the housing of the electronic apparatus, such as, the server, for example; i.e., with an aid of a free cooling, and thereby achieving a superior effect of providing the electronic apparatus, being superior in the energy saving and also the ecology, as well as, small-sizing thereof.

BRIEF DESCRIPTION OF THE SEVERAL
VIEWS OF THE DRAWING

Those and other objects, features and advantages of the present invention will become more readily apparent from the following detailed description when taken in conjunction with the accompanying drawings wherein.

DETAILED DESCRIPTION OF THE PREFERRED EMBODIMENTS

Hereinafter, embodiments according to the present invention will be fully explained by referring to the attached drawings.

<Cooling System applying Thermo Siphon>

First of all, detailed explanation will be given on a cooling system applying a thermo siphon therein, according to an embodiment of the present invention, by referring to FIGS. 1 to 12 attached herewith.

Figure 1:
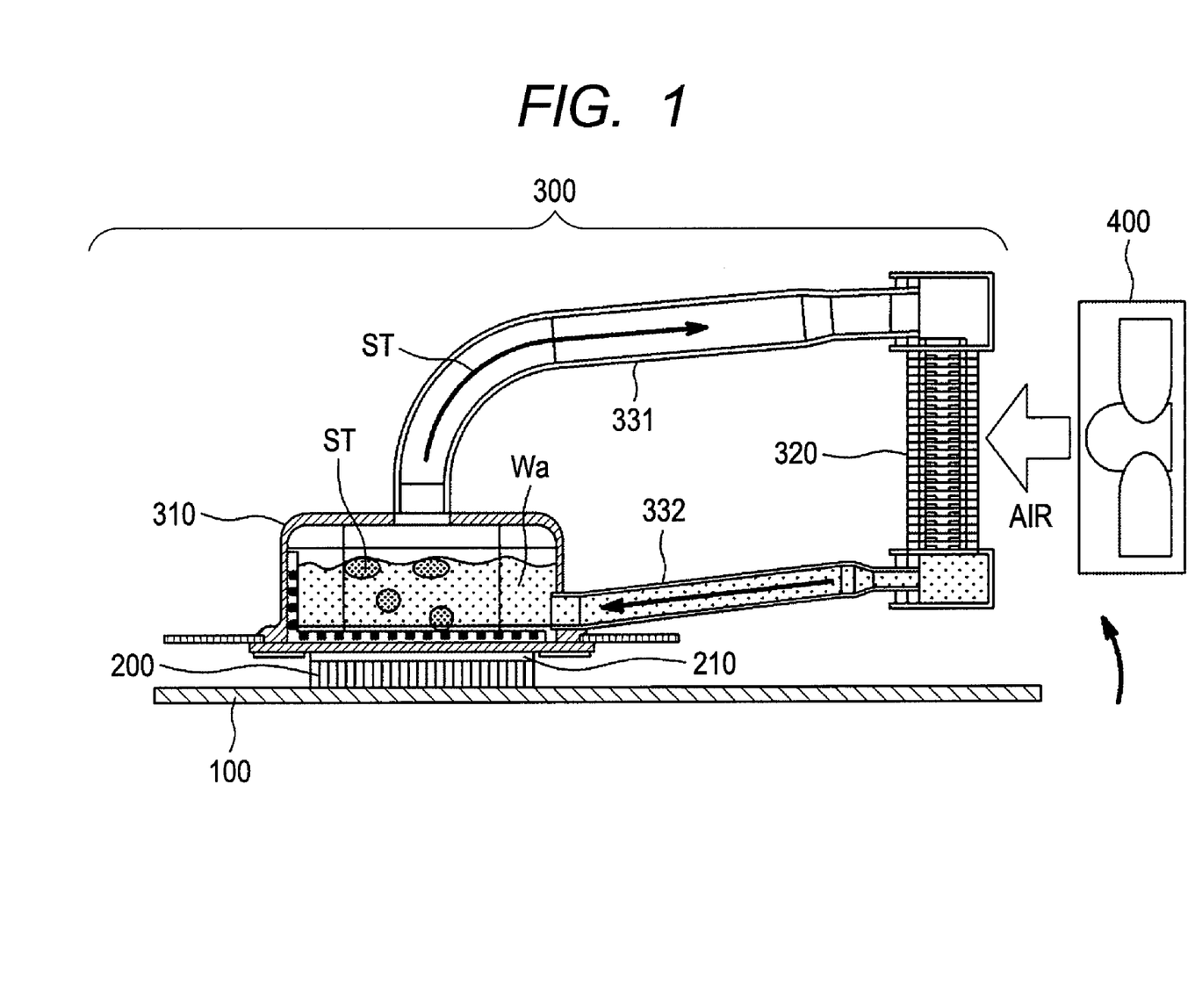
FIG. 1 is a cross-section view for showing an outline structure of a cooling system as a whole, applying a thermo siphon therein, according to en embodiment of the present invention.

FIG. 1 shows the entire structures of the cooling system applying the thermo siphon therein, and in the figure, a reference numeral 100 depicts a printed circuit board, upon a surface of which are mounted a semiconductor device 200, as the heat generation source, such as, a CPU, etc., for example. And, on the surface of that semiconductor devices 200 is attached a heat-receiving jacket 310, which builds up a part of a cooling system applying the thermo siphon therein, according to the present invention. In more details, on the surface of the semiconductor device 200 is contacting a bottom face of the heat-receiving jacket 210, while pasting thermo-conductive grease 210 on the surface thereof, for the purpose of maintaining preferable thermal connection between the heat-receiving jacket, and is fixed through fixing tools, such as, screws not shown in figure, for example. Further, the cooling system 300 comprises, although the details thereof will be explained below, as well as the heat-receiving jacket 310, a condenser 320 having a radiator, and between those are attached a pair of conduits 331 and 332, and insides of those are maintained to be a reduced (low) pressure condition, i.e., approximately $1/10$ of the atmospheric pressure.

The heat-receiving jacket 310 mentioned above builds up an evaporating area or portion, and the condenser 320 mentioned above builds up a condensing area or portion, respectively, and thereby, building up a so-called thermo siphon, which can circulate that refrigerant therein, without an external motive force, such as, an electro-motive pump, etc., due to the phase change of the water, i.e., the refrigerant, as will be explained below.

Thus, within the cooling system applying the thermo siphon therein, the outlook structure of which was mentioned in the above, the heat generating in the semiconductor device 200, being the heat generation source, is transferred to the heat-receiving jacket 310, i.e., the evaporating area or unit, through the thermo-conductive grease 210. As a result thereof, in that evaporating area or unit, the water (Wa), i.e., the refrigerant is evaporated with the heat transferred thereto under the reduced pressure, and a vapor or steam (ST) generated is guided into the condenser 320, from the heat-receiving jacket 310 passing through one of the conduits, i.e., the conduit 331. And, in this condensing area or portion, the refrigerant vapor is cooled down by an air (AIR), which is ventilated by a cooling fan, etc., as is also shown in the figure, for example, thereby resulting into a liquid (water), and thereafter it turns back into the heat-receiving jacket 310, again, passing through other conduit, i.e., the conduit 332, due to the gravity.

<Heat-Receiving Jacket>

Figure 2:
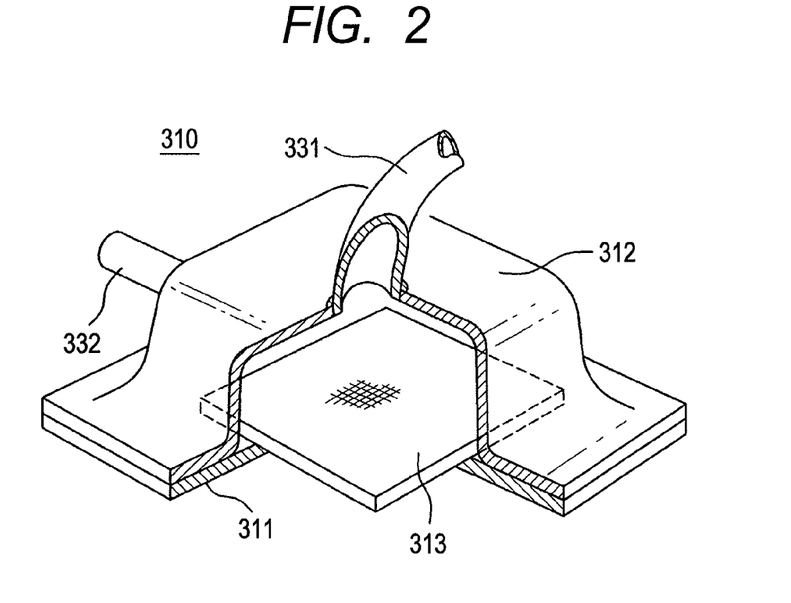
FIG. 2 is an enlarged perspective view including a partial cross-section view for showing the detailed structures of a heat-receiving jacket, building up the cooling system, which applies the thermo siphon mentioned above therein.

Herein, in FIG. 2 attached herewith is shown the detailed structures of the heat-receiving jacket 310 mentioned above, and as is shown in the figure, this heat-receiving jacket 310 is made up with, for example, putting a cover 312 made of a metal, such as, copper or stainless, etc., being formed into cup-like shape through the drawing, on a rectangular bottom plate 311 made from a metal plate, being superior in thermal conductivity, such as, copper, etc., and the peripheral portions of those are connected with, through pressure welding, for example. And, as is apparent from the figure, on an upper surface of the bottom plate 311 is attached a rectangular plate-like vaporization promoting or accelerating plate 313, and also on an upper portion and an side wall surface of the cover 312 are formed penetrating holes, respectively, with which are connected the pair of the conduits 331 and 332 are connected, respectively.

Figure 3A:
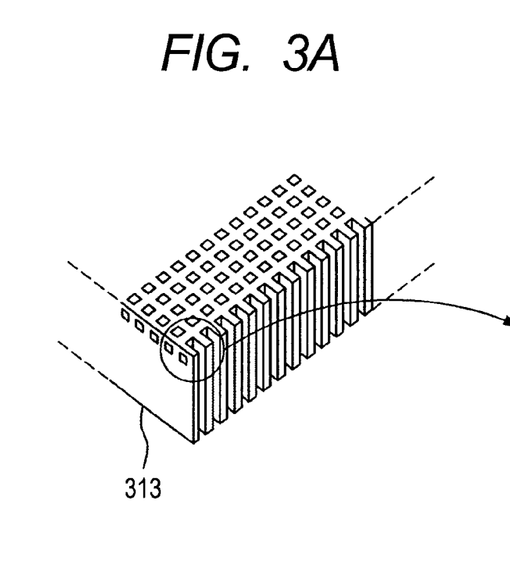
FIG. 3A is an enlarged perspective view for showing the detailed surface structure of a vaporization promoting plate building up the heat-receiving jacket mentioned above.
Figure 3B:
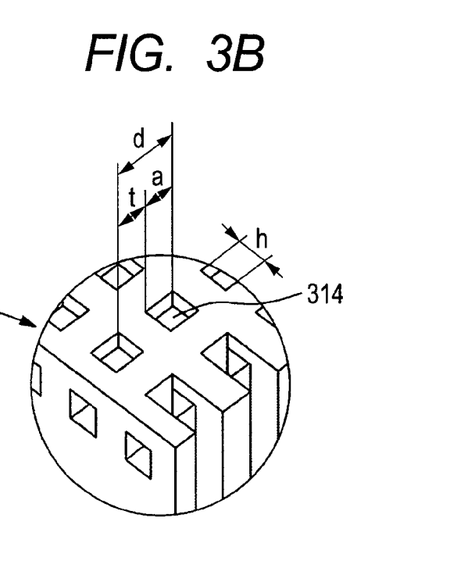
FIG. 3B is a partial enlarged perspective view, further for showing a part thereof, enlargedly.

Further, with this vaporization promoting plate 313, on the surface of a metal plate, such as, of cupper, also being superior in the thermal conductivity, there is formed a porous structure opening a large number of fine cubic holes 314, having the vertical and horizontal sizes "a" and "h" (for example, a=0.2 mm, h=0.2 mm) as is shown in FIGS. 3A and 3B attached, at a distance "t" (for example, t=0.3 mm), at a pitch "d" (for example, d=0.5 mm), in two (2) directions, i.e., the vertical direction and the horizontal direction perpendicular thereto (but, in the figure, only one direction is shown). This vaporization promoting plate 313 impregnates the liquid refrigerant dripped thereon into an inside thereof due to the capillary attraction phenomenon, and when temperature exceeds 40 through 60° C. due to heating, the liquid refrigerant begins to evaporate, i.e., vaporization, and as the temperature is high (i.e., an amount of input is large), a large amount of the liquid refrigerant is evaporated, thereby absorbing the heats therein.

Also, the vaporization promoting plate 313 having this surface of porous structure can show a stable evaporation performances or capacity (vaporization performances), as far as the liquid refrigerant does not dry out, and when an amount of heats inputted is less, the porous holes is impregnated with the liquid refrigerant filling up therein; however, when the amount of heats inputted is large, the liquid refrigerant filling up the holes is evaporated and comes to be lessen, then since a thin portion of the liquid refrigerant film increases up within an inside of the porous structure, thereby promoting the evaporation thereof, and therefore, it results into a condition of increasing the evaporating performances thereof, and thereby increasing an amount or volume of heat transfer. Thus, in addition to promotion of the evaporation depending on temperature with an increase of the amount of heats inputted, since the evaporation is promoted depending on an increase of a volume of vapor, as the amount of heats inputted becomes larger, a volume of heat transfer is increased, greatly, and thereby increasing an efficiency.

Figure 4:
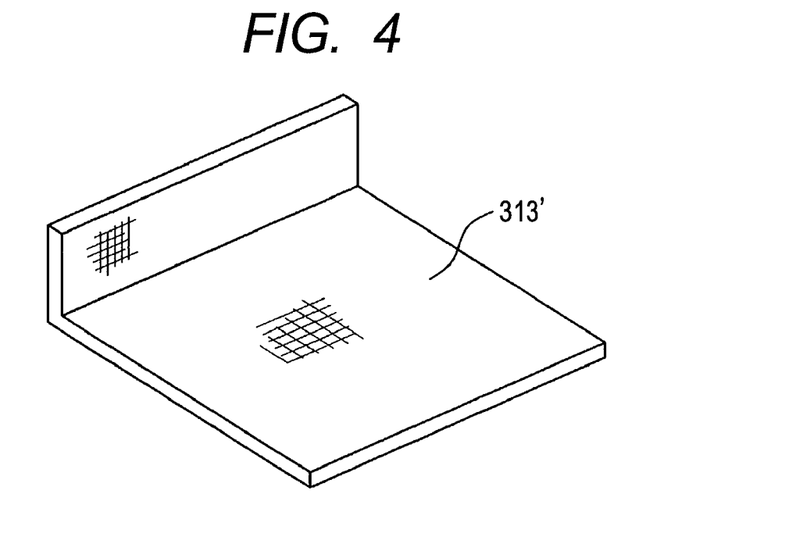
FIG. 4 is an entire perspective view for showing other example of the vaporization promoting plate mentioned above.
Figure 5:
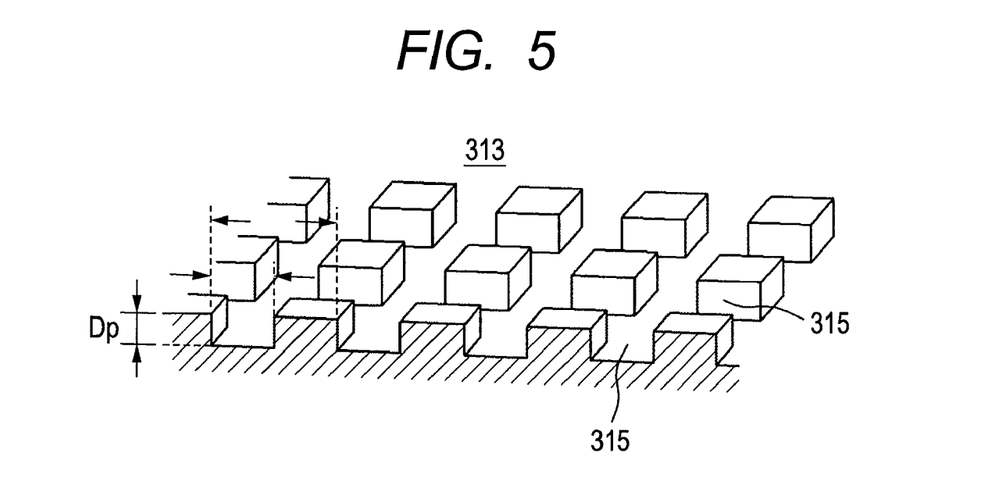
FIG. 5 is a perspective view of further other example of the vaporization promoting plate mentioned above, for showing a surface thereof, enlargedly.

Although such vaporization promoting plate 313 is attached on an inner wall side of the bottom plate 311 building up the heat-receiving jacket 310 mentioned above, through welding, etc., however, according to the present invention, it should not be limited only to this, but for example, the surface of the porous structure mentioned above may be formed, directly, on the inner wall surface of a copper plate building up that bottom plate 311. Also, this vaporization promoting plate may, for example, as is shown in FIG. 4 attached, rises up along one side of the peripheries thereof, thereby forming an "L"-like shape in the cross-section thereof. With such vaporization promoting plate 313' having the "L"-like cross-section shape, even if the semiconductor device 200, which is mounted on the printed circuit board 100 is inclined, largely, together with it (see an arrow in FIG. 1 mentioned above), the water (Wa), i.e., the refrigerant within the heat-receiving jacket 310 comes contact with a rise-up portion of that vaporization promoting plate 310, therefore the evaporation thereof is promoted or accelerated, with certainty.

Also, though one example of the surface of porous structure, which is formed on the surface of the vaporization promoting plate 313 or 313' mentioned above, is shown in FIGS. 3A and 3B mentioned above; however in the place thereof, for example, as is shown in FIG. 4, a large number of fine grooves 315 (for example, depth: Dp=1.0 mm, groove width: a=0.1 mm, pitch: d=0.2 mm) may be formed so that they intersect with each other at right angle.

Next, mentioning will be made on cooling performances or capacity when cooling down the semiconductor element, being the heat generation source within the electronic apparatus, with the cooling system applying the thermo siphon, the details of which were mentioned above. In case when cooling down the semiconductor element as the heat generation source, such as the CPU, with applying evaporation mentioned above, there is a problem, in particular, an overshoot generating when that evaporation begins.

Figure 12:
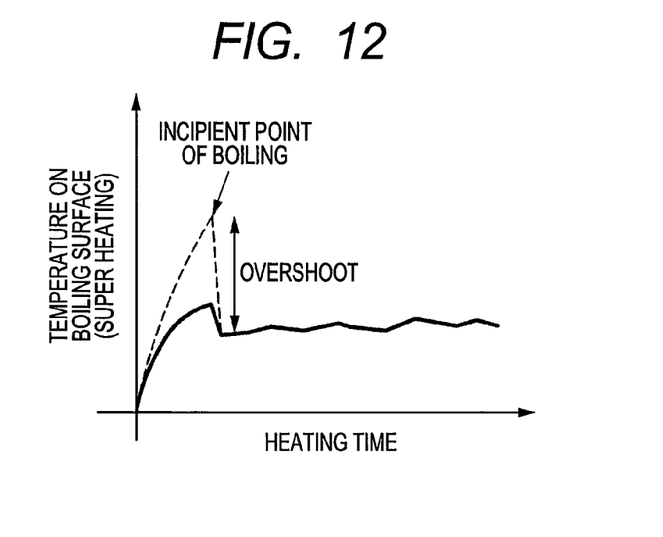
FIG. 12 is a view for showing a graph for explaining the cooling effect by means of the above-mentioned cooling system applying the thermo siphon therein.

Thus, as is shown by a broken line in FIG. 12 attached, the temperature on boiling surface thereof (i.e., super heating) goes up until evaporation begins, and falls down, abruptly, after beginning of the evaporation, i.e., an incipient point of boiling, and thereafter comes to be stable. The difference from the maximum temperature when beginning this boiling up to the temperature evaporating stably means that overshoot, and in case when designing the cooling system, design must be made by taking an amount or volume of this overshoot into the consideration thereof. By the way, with a condensing conduit of the conventional condenser, an amount or volume of this overshoot is large (see the broken line in the figure), and for that reason, in order to maintain a stable operation of the CPU, it is necessary to provide a relatively large cooling system. However, the horizontal axis of a graph in this figure indicates a time during when the evaporation surface is heated with the heat generation of the CPU (i.e., a heating time).

On the contrary to this, with the heat-receiving jacket 310 applying such vaporization promoting plate 313' having the "L"-like cross-section shape and the flat tube 323 mentioned above, on the inner wall surface of which are formed a large number of fine grooves "G", as is shown by a solid line in the figure, it is possible to reduce the amount of the overshoot mentioned above (i.e., the evaporation can begin at lower temperature), and for that reason, even with a relatively small cooling system, it is possible to maintain the cooling performances or capacity necessary for maintaining the stable operation of the CPU. In more details, due to force of the capillary tube with the fine grooves on the vaporization promoting plate mentioned above, the water being the refrigerant is sucked on the evaporation surface, and in a portion above a liquid surface is generated an evaporating vaporization phenomenon under the condition that the liquid film is thin. And, once the evaporation begins, bubbles generated pass through tunnels formed within the porous evaporation surface, and when they fill up an inside of the porous surface, since the thin portions are also generated on the liquid films within the tunnels in the porous surface below the liquid surface, then the evaporation is promoted to begin. Also, since beginning of the evaporation in a portion above the liquid surface brings the liquid refrigerant within the chamber to move, heat exchange is promoted in other portions, and it also quickens the beginning of evaporation. This can be considered to suppress the overshoot.

<Condenser>

Next, the detailed structures of the condenser 320, as a condensing area or portion of the cooling system mentioned above, applying the thermo siphon therein, will be mentioned, hereinafter, by referring to FIGS. 6 to 10.

Figure 6:
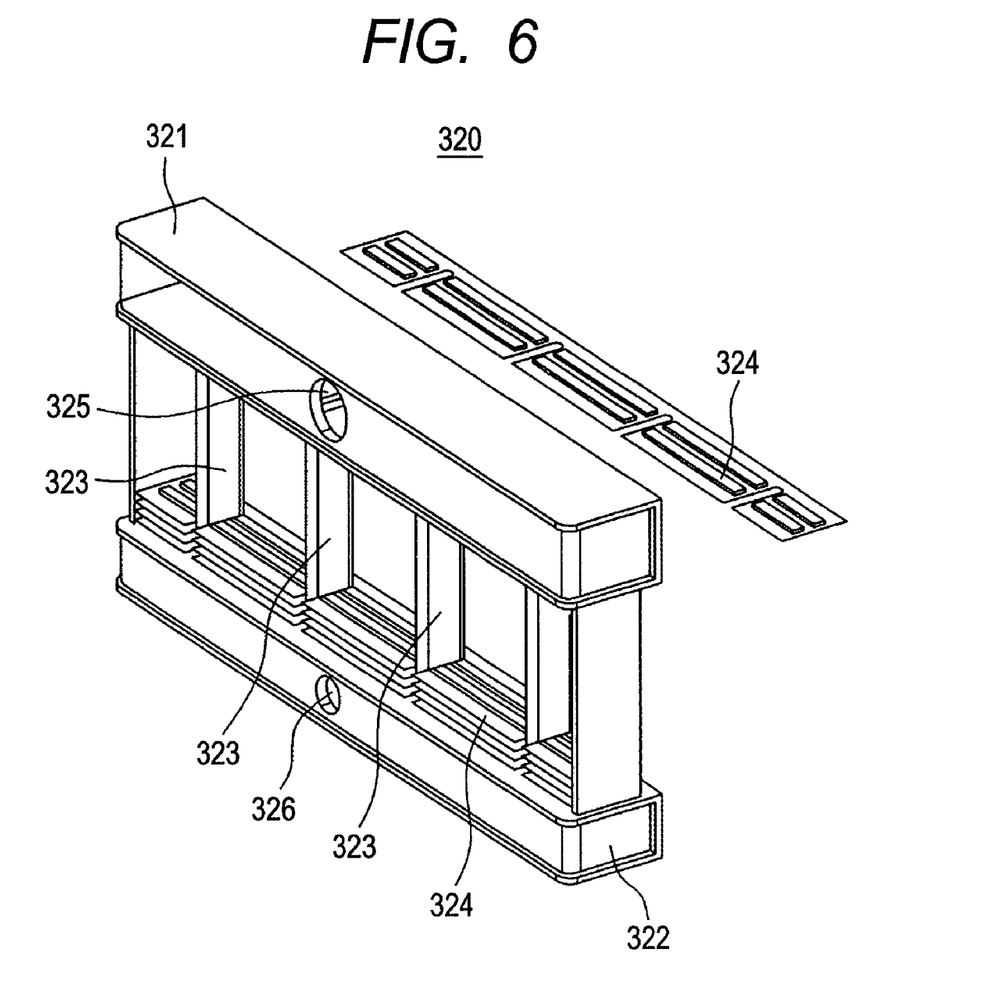
FIG. 6 is an entire perspective view for showing the detailed structures of a condenser, building up the above-mentioned cooling system applying the thermo siphon therein.
Figure 7:
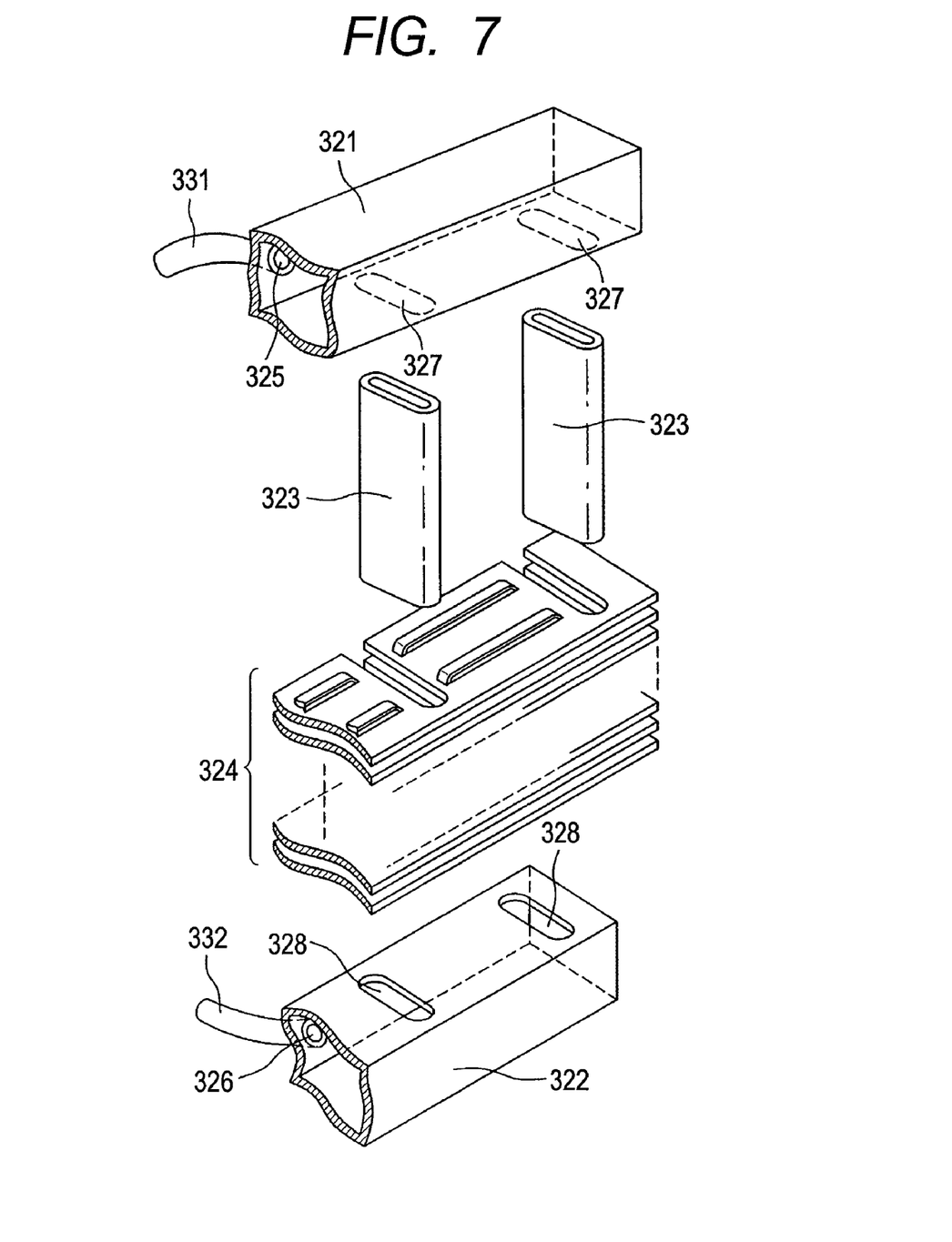
FIG. 7 is a partially exploded perspective view for showing further detailed structures of the condenser mentioned above.

First of all, in FIG. 6 is shown the entire structures of the condenser 320 under the condition of removing a part of a fin therefrom, and in FIG. 7 is shown an exploded perspective view including a partial cross-section thereof, for showing that part enlargedly. As is apparent from those figures, the condenser 320 comprises a pair of headers 321 and 322, which are disposed up and down, and between the pair of those headers 321 and 322 are connected plural numbers (four (4) pieces in the present example) of the flat tubes 323, respectively, the details of which will e mentioned hereinafter. And, in periphery of those flat tubes 323, 323 are attached offset fins 324, 324, the details of which will be mentioned hereinafter, and thereby building up a heat radiator. Further, reference numerals 325 and 326 depict penetration holes, which are formed on the pair of headers 321 and 322 mentioned above, respectively, and as is apparent from FIG. 1 or FIG. 7, with those holes are connected the pair of conduits 331 and 332, respectively.

Figure 8A:
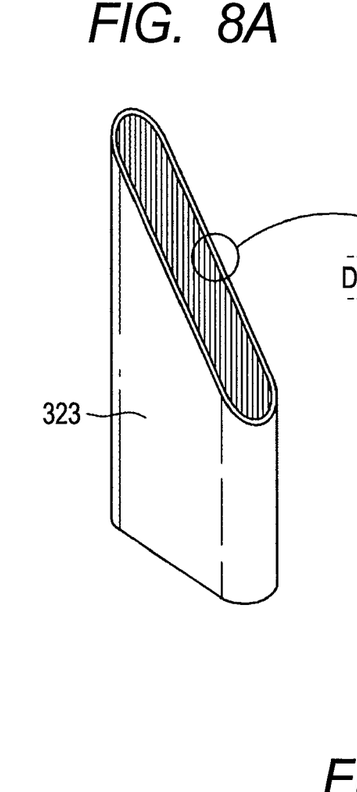
FIG. 8A is an enlarged perspective view including a cross-section thereof, for showing the detailed structures of a flat tube building up the condenser mentioned above.
Figure 8B:
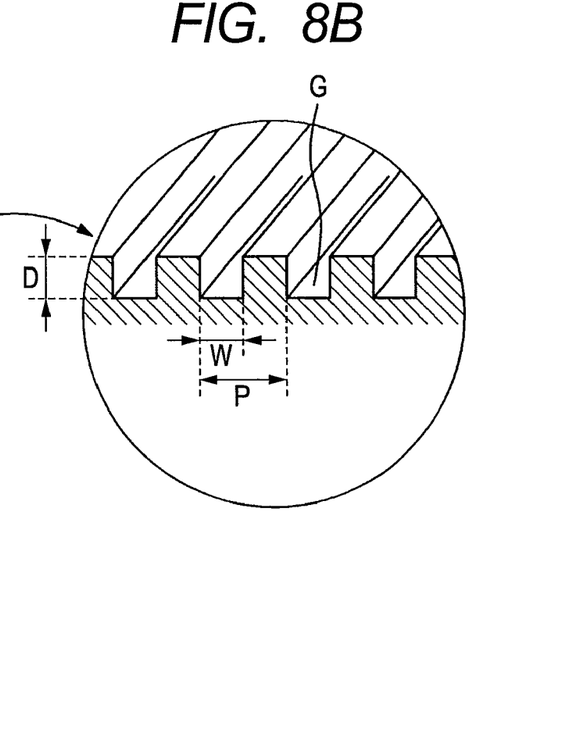
FIG. 8B is a partial enlarged view thereof.

And, as is shown in FIG. 7, the flat tube 323 is formed (deformed) from a metal tube (or a pipe), such as, of copper or the like, being superior in the thermal conductivity, to be flat in the cross-section thereof, and as is shown in FIGS. 8A and 8B attached, on the inner wall surface thereof are formed a large number of fine grooves "G" (for example, depth: Dp=1.0 mm, groove width: a=0.1 mm, pitch: d=0.3 mm). However, FIG. 8A shows one (1) piece of the flat tubes 323, including the cross-section thereof, and FIG. 8B shows a partial cross-section thereof, enlargedly (i.e., a partial enlarged view of the portion shown by "◯" in FIG. 8A).

Corresponding to the cross-sectional configuration of those flat tubes 323, penetrating holes 327 and 328 are formed, respectively, on the pair of headers 321 and 322 mentioned above, and both end portions of the flat tube 323 are inserted into the penetrating holes 327 and 328, and thereafter, they are connected with, through welding, etc.; thereby, the pair of the headers 321 and 322 mentioned above and the plural numbers of plat tubes 323 disposed between those are connected with each other, respectively.

Figure 9:
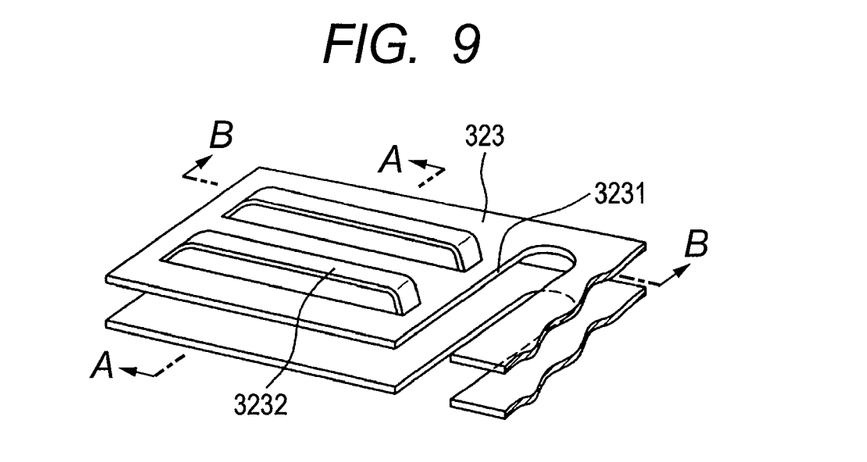
FIG. 9 is a partially enlarged perspective view for showing the detailed structures of offset fins, building up the condenser mentioned above.
Figure 10A:
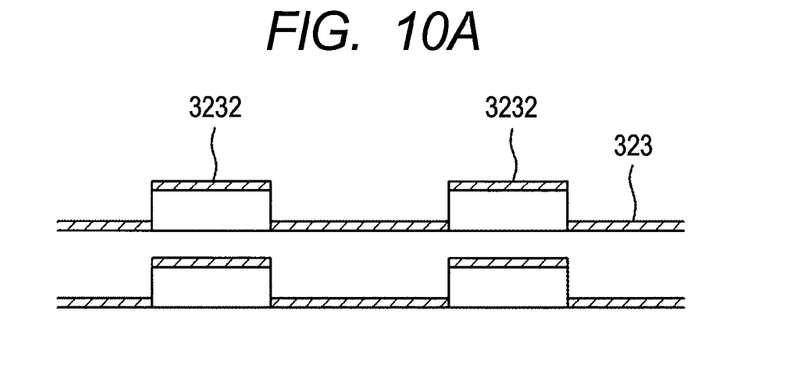
FIGS. 10A and 10B are cross-section views for showing the structures of the offset fins, along directions of arrows A-A and B-B in FIG. 9 mentioned above.
Figure 10B:
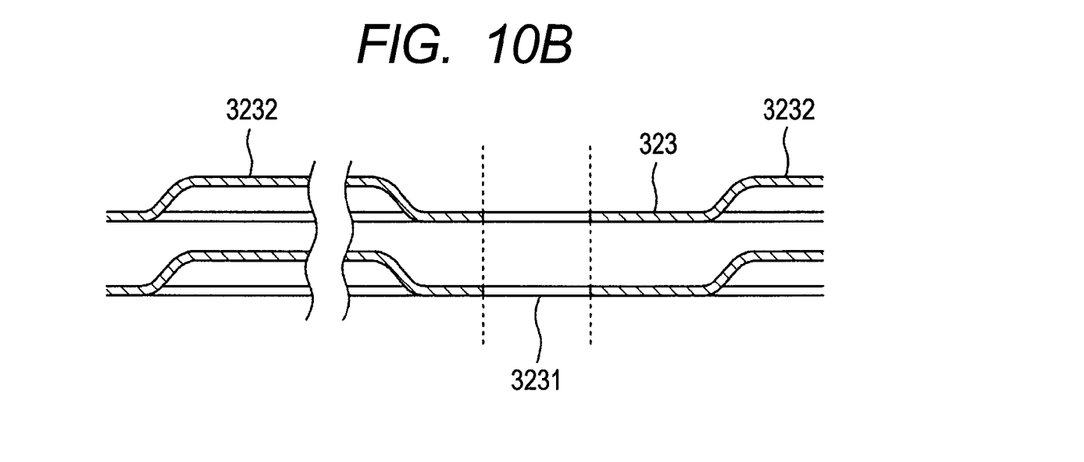

Further, in FIGS. 9 and 10 attached herewith are shown the details of the offset fin 324 mentioned above. This offset fin 324 can be obtained from a thin plate of aluminum or copper, etc., being superior in the thermal conductivity, too, for example, by machining it into a predetermined shape, for example, through punching, etc. As is apparent from those figures, on this offset fin 324, as well as, cut-out portions 3231 in "U"-like shape for inserting the above-mentioned flat tubes 323 therein, offset portions 3232 are also formed, each being cut in parallel in a portion thereof and pushed out upwards. Further, in those figures, FIG. 9 is a perspective view for showing a portion of the offset fin 324 mentioned above, enlargedly, and FIGS. 10A and 10B are cross-section views cut along arrows A-A and B-B in FIG. 9. With the structures applying such offset fin therein; it is possible to increase volumetric efficiency of the heat radiation performances of capacity.

As is apparent from the above, with the condenser 320 mentioned above, the vapor of refrigerant moving from the heat-receiving jacket 310 mentioned above is guided into the plural numbers of flat tubes through an upper header 321 is cooled down through the wall surface of the tube in the process thereof by an outer air; thus, it is condensed while transferring heats (i.e., radiating heats) to the air of an outside, and returns from the vapor into the refrigerant, again. Thereafter, due to the gravity thereof, passing through a return conduit 332, it turns back to the heat-receiving jacket 310. Namely, inside the thermo siphon, the refrigerant is transferred, but without using a liquid pump, etc., in the congenital manner, and continues to circulate therein. As a result thereof, it is not necessary to provide such a motive power of the pump for driving the liquid; thereby achieving the energy saving.

Figure 11A:
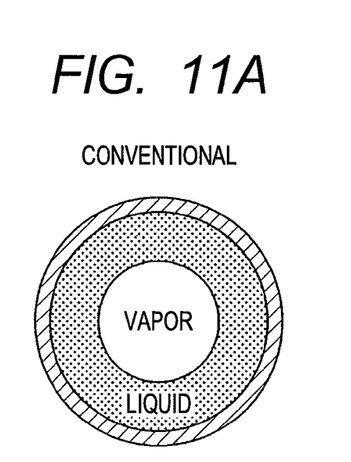
FIGS. 11A and 11B are cross-section views for showing the flat tube comparing to a circular tube of the conventional technology, for explaining behavior of refrigerant within the flat tube and a cooling effect therewith.
Figure 11B:
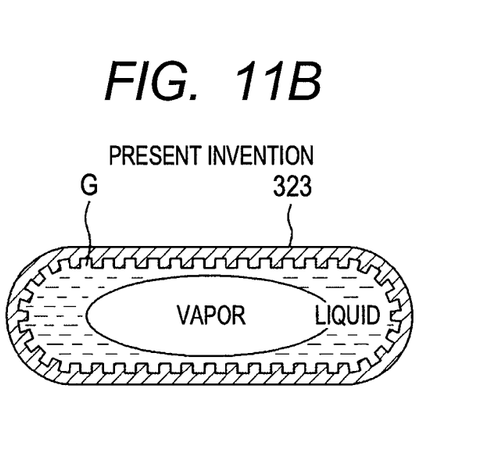

In that instance, in particular, as was mentioned above, with an aid of the flat tube 323 mentioned above, on the inner wall surface of which are formed the large numbers of fine grooves "G", as is shown in FIG. 11B attached, the liquid refrigerant condensed on the wall surface of the tube builds up a thin liquid film, with the force of capillary tube due to the fine grooves "G", on the wall surface of the tube having the flatten cross-section, while building up a thick liquid film on a curved portion thereof. In this portion of thin liquid film, since waves stand on the liquid surface due to a shearing force of a stream of vapor, and then the convex portions of the fine grooves "G" expose in the vapor, therefore the condensation heat transfer coefficient can be increased. Also, in a portion where the amount of the condensed liquid is less, because of the fine grooves "G" formed on the tube wall, since the grooves are always kept in a wetted condition in the inside thereof, with the capillary forced due to the grooves, the liquid is suppressed from growing into a liquid drop obstructing a flow of the vapor, and also the liquid film is kept in the condition of being thin. Therefore, with the flat tube 323 forming the large numbers of fine grooves "G" on the inner wall surface thereof, since it is possible to buildup the thin liquid film, with stability, in particular, on the flat portion having a large area, it is possible to increase an efficiency for the vaporized refrigerant to transfer the condensation heat on the surface of the tube wall, i.e., so-called the condensation heat transfer coefficient, and thereby it is possible to improve the performances or capacity of the condenser 320. However, FIG. 11A shows the conventional one of a circular tube, which was applied in the conventional condenser, and in this case, as apparent from the figure, since the liquid refrigerant adheres on the tube surface, almost uniformly, the efficiency for the vaporized refrigerant to transfer the condensation heat on the surface of the tube wall is lowered down. In addition thereto, with attachment of large numbers of the offset fines 324 mentioned above on an outer periphery of the flat tube 323 mentioned above, it is apparent for the person skilled in the art, that the heat transfer efficiency can be increased, further, from that flat tube 323 to the outside air (i.e., cooling wind), and that the radiator can be made small in the sizes thereof.

<Electronic Apparatus Applying Cooling System Therein>

Following the above, detailed explanation will be made on an example of the electronic apparatus, adopting the cooling system utilizing the thermo siphon mentioned above therein, hereinafter, by referring to FIGS. 13 through 15.

Figure 13:
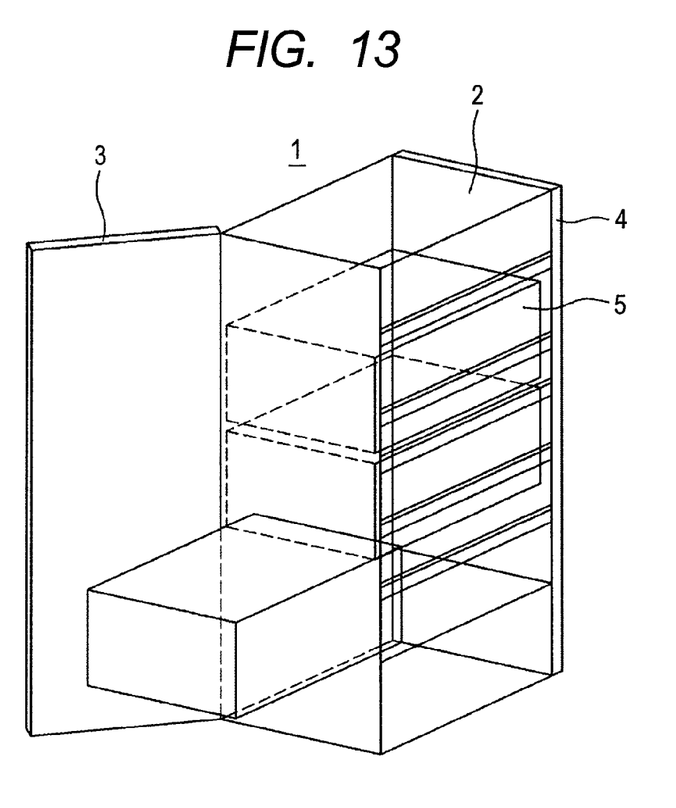
FIG. 13 is a perspective view for showing the entire structures of servers mounted on a rack, as one example of the electronic apparatus adopting therein the cooling system applying the thermo siphon therein, according to the present invention.

First of all, FIG. 13 attached shows a server, in particular, plural numbers of servers mounted on a rack, in an outlook perspective view thereof, as a representative one of the electronic apparatuses, into which the cooling system utilizing the thermo siphon therein, according to the present invention. In the figure, a rack 1 includes a housing 2 and covers 3 and 4 (a reference numeral 4 depicts a front cover, and 4 a rear cover), and within an inside thereof, there are provided plural numbers of server housings 5, each being formed in a predetermined shape/sizes, in a detachable manner.

Figure 14:
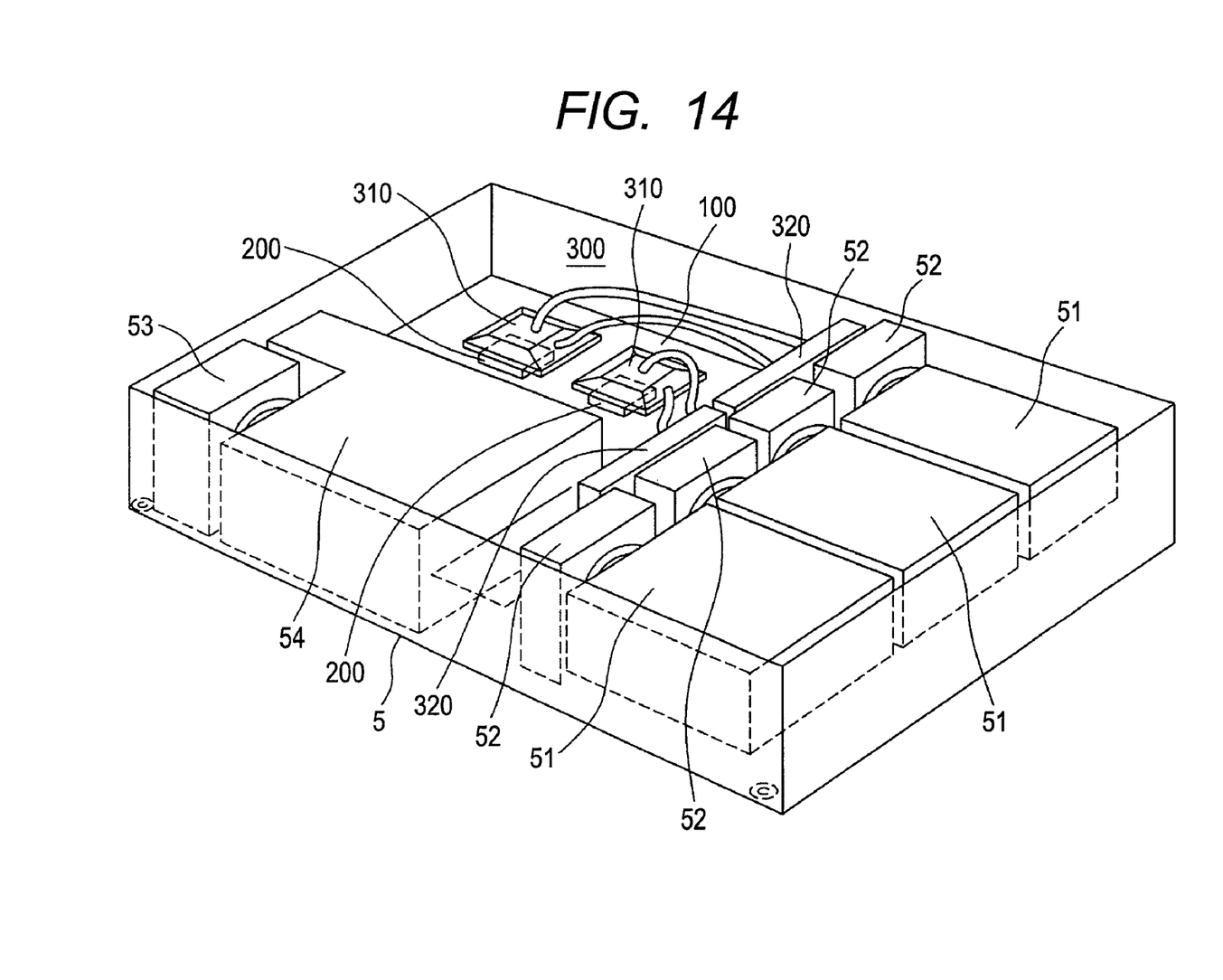
FIG. 14 is a perspective view for showing an example of the inner structures within the housing of the server mentioned above, under the condition of taking out a cover thereof.
Figure 15:
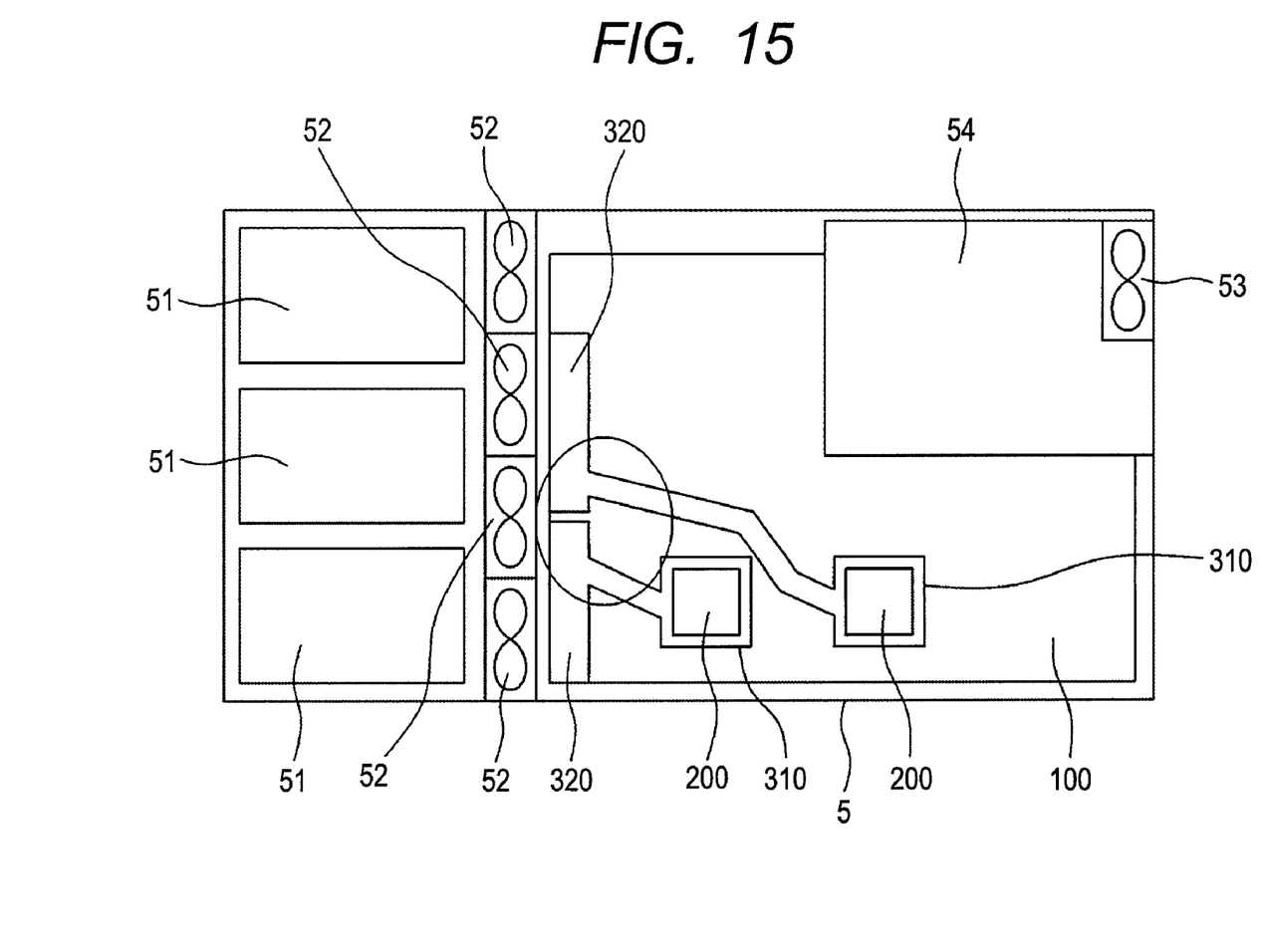
FIG. 15 is a top plane view for explaining a condition of disposing the cooling system within the above-mentioned housing of the server.

In an inside of each of those plural numbers of server housings 5, in general, plural numbers (three (3) sets in the present example) of hard disk drives 51, 51 . . . , as the large capacity recording apparatuses, on one surface thereof (a front surface shown on the right-hand side in the figure, in the present example), by taking maintenances thereof into the consideration, as is shown in FIGS. 14 and 15 attached, and behind those are attached plural numbers (four (4) sets in the present example) of cooling fans 52, 52 . . . , for the purpose of air-cooling of those hard disk drives, also being the heat generation source in the housing. And, in a space defined between the other surface of the server housing 5 (i.e., a back space), there is provided a block 54, storing an electric power source and/or an interface of communication means, such as, a LAN, etc., with a cooling fan 53, as well, and further in the remaining space is disposed the printed circuit board 100 mentioned above, mounting plural numbers (two (2) sets in the present example) of CPUs 200 and 200, as being the heat generation sources, thereon. However, the perspective view of this FIG. 14 shows the condition of removing the cover therefrom.

And, as is apparent from this figure, for each CPU 200, there is provided the cooling system 300 mentioned above, utilizing the thermo siphon therein, according to the present invention, respectively. Thus, on a surface of the CPU 200 is located the heat-receiving jacket 310 mentioned above being in contact with the bottom surface thereof, through the thermo-conductive grease pasted therebetween; thereby maintaining preferable thermal connection therebetween. And, according to the present invention, the condenser 320, each having the offset fins for building up the cooling system 300, are disposed in the rear of the four (4) sets of the cooling fans 52, 52 . . . , for air-cooling the hard disk drives mentioned above. Thus, the condensers 320 for building up the cooling system are disposed, aligning along a path of the air (i.e., the cooling wind) supplied from the outside by means of the cooling fans 52, 52 . . . . Namely, the condensers 320 each having the offset fins are attached, aligning in parallel with a line of the cooling fans 52, 52 . . . mentioned above.

In this manner, with the structure of the electronic apparatus mentioned above, the cooling fans 52, 52 . . . , as being a cooling means of other apparatus(es) installed within the housing 5 thereof, are utilized (or, commonly used) as the cooling means (i.e., the radiators) of the condensers 320 for building up the cooling system 300 utilizing the thermo siphon therein, according to the present invention. With this fact, it is possible to cool down the CPUs 200 as the heat generation sources in the housing, effectively and with certainty, without providing the cooling fans for exclusive use, in other words, by means of the cooling system, being relatively simple and cheap, i.e., needing no motive power of the pump for driving the liquid and being superior in the energy saving. Also, with utilizing the cooling system 300 applying the thermo siphon according to the present invention, because of the structure of being relatively high in an efficiency of heat exchange, and also being relatively simple, it is also possible to make an arrangement thereof with having high freedom, even in the electronic apparatus, such as, the server or the like, on which mounting of high density is required.

Also, as is apparent from those figures, the condensers 320 building up the cooling system 300, are disposed, respectively, so that each covers on an exhaust surface of the plural numbers (two (2) sets in the present example) of cooling fans. However, with such structures, even if the cooling fan is stopped due to any one of malfunctions thereof, the cooling of the condenser 320 can be succeeded or continued with cooling wind, which is generated by the remaining cooling fan(s); in other words, it is possible to maintain the redundancy, and therefore, this is preferable to be the structures of the cooling system for the electronic apparatuses. Also, in particular, as is indicated within "◯" in FIG. 15, with bringing the positions attaching the vapor conduits 331, for guiding the refrigerant vapor generating within the heat-receiving jacket 310 into the condenser 320, on the head (see 321 in FIG. 7), to a side of the cooling fan, being small in an area facing to the condenser as being the radiator, it is possible to increase the redundancy thereof, further, against the stoppage of the cooling fan because of any malfunction therein.

In the present embodiment, three (3) sets of the cooling fans are used for the condensers of two (2) set of the thermo siphons; i.e., 1.5 sets of the cooling fans are prepared for one (1) set of the condenser. In this instance, if one (1) set of the cooling fan stops, then cooling is made by the remaining 0.5 set of the fan, and therefore falling in the condition, being equal to that the heat radiation cannot be made on ⅔ part of the radiator of the thermo siphon condenser. In the server system, since a certain period of time is needed until the time when the system normally ends the operation, even in time of an emergency, during that time-period, it is necessary to maintain the cooling performances. With the radiator of the conventional water-cooling method, since the refrigerant flows in the entire of the radiator, equally or uniformly, then the cooling performances by the refrigerant fall down for that if an effective heat radiating area is lowered down to ⅔, and that portion lowering down the cooling performances contributes to an increase of temperature, directly. However, within the system applying the thermo siphon therein, in a portion of the radiator where no heat radiation is made, since the vapor cannot be condensed, then as a result, the vapor concentrates in the remaining portions where the cooling is still made. The vapor concentrating in the portions has a high flow velocity, it washes away the liquid film within the flat tube, and this contributes to an increase of the condensing performances. Also, within the thermo siphon of the present embodiment, the vapor has a tendency that much of it easily flows in the flat tube 323 close to the conduit 331 for supplying the vapor into the condenser, and with applying this characteristic, effectively, the positions where the vapor conduits 331 are attached on the head (see 321 in FIG. 7) are shifted to the side of the cooling fan having a small area facing to the condenser, as being the radiator, and thereby it is possible to suppress the lowering of the performances of heat radiation when one (1) set of the cooling fans stops. For this reason, applying the thermo siphon therein, it is possible to maintain the redundancy, with a less number of sets of the fans provided.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A cooling system for cooling a semiconductor device mounted on an electronic printed circuit board, which is stored within a housing of an electronic apparatus, comprising:
   a heat-receiving jacket, which is attached on said semiconductor device, being thermally connected with a surface thereof, and which vaporizes a liquid refrigerant received within a pressure-reduced inner space thereof, with heat generation from said semiconductor device;
   a condenser, which stores the refrigerant vapor from said heat-receiving jacket in a pressure-reduced inner space thereof and condenses the refrigerant vapor by transferring heat outside of the apparatus;
   a first conduit, which guides the refrigerant vapor from said heat-receiving jacket into said condenser; and
   a second conduit, which guides the liquid refrigerant from said condenser into said heat-receiving jacket, and thereby applying a thermo siphon for circulating said refrigerant due to phase changes thereof, wherein
   said condenser has a plurality of cooling tubes for cooling down the refrigerant vapor from said heat-receiving jacket on an inner wall surface thereof, and each of said cooling tubes forms fine grooves on the inner wall surface along a direction of flow of the refrigerant, and is formed flat in a cross-section thereof.

2. The cooling system described in the claim 1, wherein said cooling tube is disposed into a vertical direction.

3. The cooling system described in the claim 2, wherein the inner wall surface in a cross-section of said cooling tube has a flat portion and a curved portion.

4. The cooling system described in the claim 3, wherein at an upper and a lower end of said cooling conduit are provided header portions, respectively.

5. The cooling system described in the claim 4, wherein heat radiating fins are provided on a periphery of said cooling conduit.

6. The cooling system described in the claim 5, wherein said heat radiating fins are offset-fins.

7. The cooling system described in the claim 1, wherein said heat-receiving jacket is provided with a porous structure surface on the inner wall surface to be in contact with the surface of said semiconductor.

8. The cooling system described in the claim 7, wherein said porous structure surface is formed in an about "L"-like shape.

9. The cooling system described in the claim 1, further comprising a ventilating means, which is configured to supply an air from the outside of the electronic apparatus onto a part of said condenser, and discharges the heat into the outside of the apparatus from said condenser.

10. The cooling system described in claim 1, wherein the cooling tubes are arranged such that a flat inner wall surface portion of the cooling tubes is substantially perpendicular to the longitudinal direction of the condenser.

11. The cooling system described in claim 1, wherein heat radiating fins are provided on a periphery of the cooling tubes, and the heat radiating fins have cut-out portions in a "U"-like shape for inserting the cooling tubes therein.

12. An electronic apparatus, storing an electronic printed circuit board mounting a semiconductor device on a surface thereof within a housing thereof, and having a cooling fan in a part thereof, thereby cooling equipments stored within said housing with supplying an air from an outside thereon, comprising:
   a cooling system as described in the claim 1,
   wherein said condenser building up said cooling system is disposed along a path of the air from the outside, which is supplied by said cooling fan.

13. The electronic apparatus, as described in the claim 12, wherein on said electronic printed circuit board are mounted plural numbers of semiconductor devices, and said cooling system for use of said electronic apparatus is provided for each of said semiconductor devices, respectively.

14. The electronic apparatus, as described in the claim 13, further comprising cooling fans in plural numbers thereof, wherein a number of said cooling systems is less than a number of said cooling fans.

* * * * *